United States Patent
Ricks et al.

(10) Patent No.: US 8,022,624 B2
(45) Date of Patent: Sep. 20, 2011

(54) MOISTURE PROTECTION FOR OLED DISPLAY

(75) Inventors: Michele L. Ricks, Rochester, NY (US); Michael L. Boroson, Rochester, NY (US)

(73) Assignee: Global OLED Technology LLC, Herndon, VI (US)

( * ) Notice: Subject to any disclaimer, the term of this patent is extended or adjusted under 35 U.S.C. 154(b) by 344 days.

(21) Appl. No.: 11/739,703

(22) Filed: Apr. 25, 2007

(65) Prior Publication Data

US 2008/0265753 A1    Oct. 30, 2008

(51) Int. Cl.
*H05B 33/00* (2006.01)

(52) U.S. Cl. ......................... 313/512; 313/504
(58) Field of Classification Search .......... 313/498–512; 315/169.3; 345/36, 45, 76
See application file for complete search history.

(56) References Cited

U.S. PATENT DOCUMENTS

| | | |
|---|---|---|
| 4,081,397 A | 3/1978 | Booe |
| 4,769,292 A | 9/1988 | Tang et al. |
| 4,885,211 A | 12/1989 | Tang et al. |
| 5,962,962 A * | 10/1999 | Fujita et al. ............... 313/412 |
| 6,175,186 B1 * | 1/2001 | Matsuura et al. ............ 313/483 |
| 6,226,890 B1 | 5/2001 | Boroson et al. |
| 6,635,988 B1 * | 10/2003 | Izumizawa et al. .......... 313/504 |
| 6,664,563 B2 * | 12/2003 | Yamada et al. ............... 257/40 |
| 6,833,668 B1 * | 12/2004 | Yamada et al. .............. 313/505 |
| 6,965,195 B2 * | 11/2005 | Yamazaki et al. ........... 313/498 |
| 7,189,999 B2 * | 3/2007 | Yamazaki et al. ............. 257/72 |
| 2003/0110981 A1 | 6/2003 | Tsuruoka et al. |
| 2004/0043249 A1 * | 3/2004 | Su et al. ...................... 428/690 |
| 2004/0164676 A1 * | 8/2004 | Omura et al. ................ 313/512 |
| 2004/0245919 A1 * | 12/2004 | Kim .............................. 313/504 |
| 2004/0263075 A1 * | 12/2004 | Otsuki et al. ................ 313/512 |
| 2005/0023974 A1 * | 2/2005 | Chwang et al. .............. 313/512 |
| 2005/0260337 A1 * | 11/2005 | Ogura et al. .................. 427/66 |
| 2006/0158111 A1 * | 7/2006 | Hayashi ....................... 313/512 |
| 2006/0244376 A1 * | 11/2006 | Chun et al. .................. 313/506 |

* cited by examiner

*Primary Examiner* — Nimeshkumar Patel
*Assistant Examiner* — Christopher Raabe
(74) *Attorney, Agent, or Firm* — Morgan, Lewis & Bockius LLP

(57) ABSTRACT

An OLED display, comprising: a substrate; an OLED having two spaced-apart electrodes and organic layers disposed therebetween and the OLED being disposed over the substrate; first desiccant material disposed over at least a portion of one of the electrodes; a compliant protection layer having a Young's Modulus <4 GPa disposed over at least a portion of the first desiccant material; and an encapsulation container fixed to the substrate and disposed over the compliant protection layer.

20 Claims, 1 Drawing Sheet

MOISTURE PROTECTION FOR OLED DISPLAY

FIELD OF THE INVENTION

The present invention relates to OLED displays and more particularly to providing moisture, electrical, and mechanical protection for the OLED in the display.

BACKGROUND OF THE INVENTION

An organic light-emitting diode device, also called an OLED device, commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing, and capability for full-color flat emission displays. Tang et al. described this multilayer OLED device in their U.S. Pat. Nos. 4,769,292 and 4,885,211.

A common problem with OLED displays is sensitivity to moisture. They can be particular highly moisture-sensitive electronic devices, and require humidity control to levels below about 1000 ppm and some require humidity control below even 100 ppm.

Numerous publications describe methods or materials for controlling humidity levels within enclosed or encapsulated electronic devices. Kawami et al., in U.S. Pat. No. 5,882,761, has taught the use of a desiccant layer over the organic layers of an OLED display, between the substrate and the top seal. Kawami et al. teach the use of the following desiccants: alkali metal oxides, alkali earth metal oxides, sulfates, metal halides, and perchlorates. Such materials can be deposited in a predetermined shape by such techniques as vacuum vapor deposition, sputtering, or spin-coating. In U.S. Pat. No. 6,226,890, Boroson et al., disclose the use of a castable blend of the above desiccants with a suitable binder. Kawami et al., in the '761 patent, have taught that the drying agent is to be coated on the inside surface of an airtight container. Boroson et al., in the '890 patent, use the castable blend to coat the interior surface of an enclosure. Techniques such as these require additional materials and efforts. In U.S. Patent Application Publication 2003/0110981, Tsuruoka et al., have disclosed a series of transparent drying agents, which operate by chemisorption and can be used in an OLED display. These are conceived as useful in OLED devices wherein one wishes to allow light emission through a desiccant layer. In U.S. Pat. No. 4,081,397, Booe, describes a composition used for stabilizing the electrical and electronic properties of electrical and electronic devices. The composition comprises alkaline earth oxides such as barium oxide in an elastomeric matrix.

To address the moisture-sensitivity problem, an encapsulation container often encloses the OLED device and is secured to the substrate to form an enclosure. Desiccant material is formed on the inside of the enclosure to protect the OLED from moisture. A problem with this arrangement is that when the OLEDs become large in size, the substrate typically has to flex and there is some likelihood that the encapsulation container will come in contact with the OLED. This can cause mechanical damage to one of the electrodes or shorting.

SUMMARY OF THE INVENTION

It is therefore an object of the present invention to provide improved moisture protection for an OLED in an OLED display while reducing the likelihood of mechanical damage to the electrode or shorting.

This object is achieved by an OLED display, comprising:
a. a substrate;
b. an OLED having two spaced apart electrodes and organic layers disposed there between and the OLED being disposed over the substrate;
c. first desiccant material disposed over at least a portion of one of the electrodes;
d. a compliant protection layer having a Young's Modulus <4 GPa disposed over at least a portion of the first desiccant material; and
e. an encapsulation container fixed to the substrate and disposed over the compliant protection layer.

ADVANTAGES

It is an advantage of this invention that it can enable low-cost, thin OLED displays by allowing a flexible encapsulation while maintaining mechanical and electrical protection of the display.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels. The term "bottom-emitting" refers to display devices that emit light and are viewed through the substrate upon which they are based. The term "top-emitting" refers to display devices in which light is primarily not emitted through the substrate but opposite to the substrate, and are viewed through the side opposite to the substrate. The term "sealing material" is employed to designate organic, inorganic, or combination organic and inorganic materials used to bond encapsulation enclosures to substrates and to protect one or more highly moisture-sensitive electronic devices from moisture by preventing or limiting moisture permeation through the sealing materials. The term "desiccant" is employed to designate organic or inorganic materials used to physically or chemically absorb or react with moisture that would otherwise damage the highly moisture-sensitive electronic devices.

Figure 1:
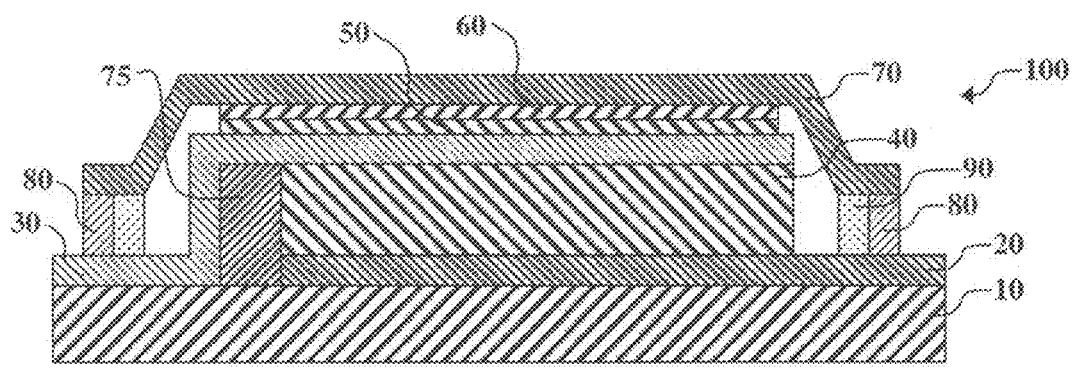
FIG. 1 shows a cross-sectional view of one embodiment of an encapsulated OLED device in accordance with this invention.

Turning now to FIG. 1, there is shown a cross-sectional view of one embodiment of an encapsulated OLED display in accordance with this invention. OLED display 100 is formed over substrate 10. OLED display 100 includes an OLED disposed over substrate 10 and comprising organic layers 40 disposed between spaced-apart electrodes 20 and 30. An insulator 75 can be used to prevent contact between electrodes 20 and 30. A first desiccant material 50 is disposed over at least a portion of electrode 30, and a compliant protection layer 60 is disposed over at least a portion of first desiccant material 50. An encapsulation container 70 is disposed over compliant protection layer 60 and is fixed to substrate 10, e.g. by sealing material 80. A second desiccant material 90 can be located inside of sealing material 80 to protect the OLED display from moisture incursion around or through sealing material 80.

Figure 2:
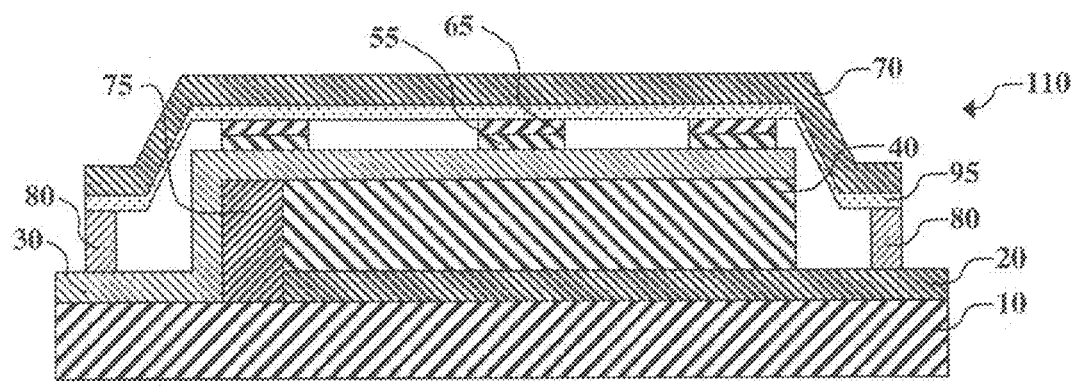
FIG. 2 shows a cross-sectional view of another embodiment of an encapsulated OLED device in accordance with this invention.

Turning now to FIG. 2, there is shown a cross-sectional view of another embodiment of an encapsulated OLED display in accordance with this invention. OLED display 110 has two electrodes 20 and 30, and organic layers 40 therebetween, disposed over substrate 10. First desiccant material 55 is disposed over at least a portion of electrode 30, and a compliant protection layer 65 is disposed over at least a portion of the first desiccant material 55. FIG. 2 shows that it is not necessary to cover all or even most of electrode 30, but the compliant protection layer must be sufficient to prevent encapsulation container 70 from contacting electrode 30 at any point.

In OLED display 110, encapsulation container 70 is spaced from compliant protection layer 65, thus forming an enclosure wherein second desiccant material 95 is disposed. Second desiccant material 95 can be formed on the inner surface of encapsulation container 70.

Figure 3:
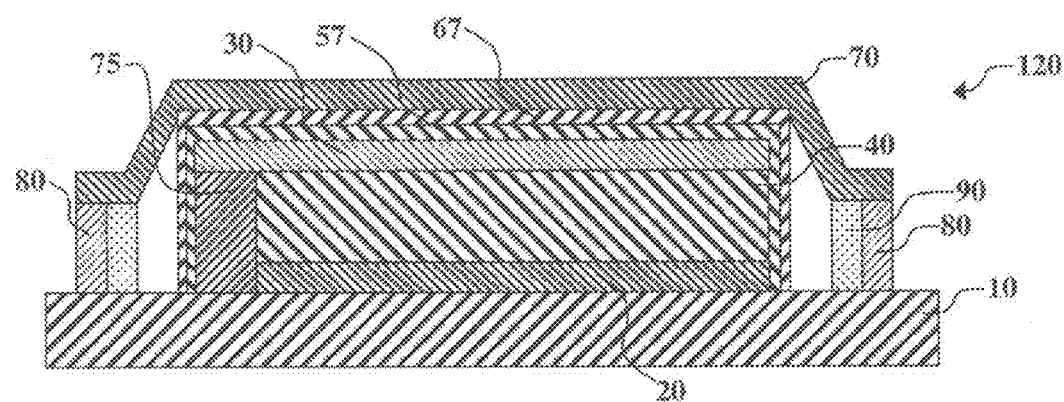
FIG. 3 shows a cross-sectional view of another embodiment of an encapsulated OLED device in accordance with this invention.

Turning now to FIG. 3, there is shown a cross-sectional view of another embodiment of an encapsulated OLED display 120 in accordance with this invention. In OLED display 120, first desiccant material 57 and compliant protection layer 67 cover electrode 30 and organic layers 40, and are in contact with substrate 10. This can protect the edges of electrode 30 from contact by encapsulation container 70.

The second desiccant material is used to physically or chemically absorb or react with moisture that would otherwise damage the highly moisture-sensitive OLED device 20. The level of moisture inside sealing material 80 must be kept below 1000 ppm, and in some cases even lower. Therefore, the second desiccant material has an equilibrium humidity level less than 1000 ppm. Typical moisture-absorbing materials meeting this requirement include metals such as alkali metals (e.g. Li, Na), alkaline earth metals (e.g. Ba, Ca), or other moisture-reactive metals (e.g. Al, Fe); alkaline metal oxides (e.g. $Li_2O$, $Na_2O$); alkaline earth metal oxides (e.g. MgO, CaO, BaO); sulfates (e.g. anhydrous $MgSO_4$); metal halides (e.g. $CaCl_2$); perchlorates (e.g. $Mg(ClO_4)_2$); molecular sieves; tris(8-quinolinolato)aluminum (Alq) and aluminum/Alq mixtures; organometallic compounds described by Takahashi et al. in U.S. Pat. No. 6,656,609 and by Tsuruoka et al. in U.S. Patent Application 2003/0110981, including organometallic compounds of the type:

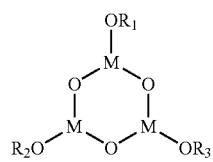

wherein $R_1$, $R_2$, and $R_3$ are selected from the group consisting of alkyl groups, aryl groups, cycloalkyl groups, heterocyclic groups, and acyl groups having one or more carbon atoms, and M is a trivalent metallic atom; organometallic compounds of the type:

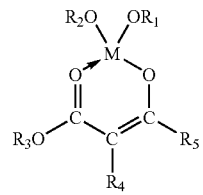

wherein each of $R_1$, $R_2$, $R_3$, $R_4$, and $R_5$ is selected from the group consisting of alkyl groups, alkenyl groups, aryl groups, cycloalkyl groups, heterocyclic groups, and acyl groups having one or more carbon atoms, and M is a trivalent metal atom; organometallic compounds of the type:

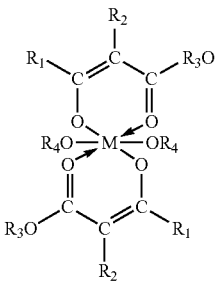

wherein each of $R_1$, $R_2$, $R_3$, and $R_4$ is selected from the group consisting of alkyl groups, alkenyl groups, aryl groups, cycloalkyl groups, heterocyclic groups, and acyl groups having one or more carbon atoms, and M is a tetravalent metal atom; and metals with work functions less than 4.5 eV oxidizable in the presence of moisture, or combinations thereof. Moisture-absorbing material can be packaged within moisture permeable containers or binders. The second desiccant material can be a single material, a homogeneous mixture of materials, a composite of materials, or multiple layers of materials, and can be deposited from a vapor or from solution, or they can be provided in a porous matrix such as a permeable package or tape. Particularly useful desiccant materials include those that are particulate materials formed into a polymeric matrix that can be patterned, as described by Boroson et al. in U.S. Pat. No. 6,226,890.

The first desiccant material in this invention will serve primarily to remove moisture that can be trapped in the compliant protection layer. Because it needs only to remove a small amount of moisture, the first desiccant material can comprise a desiccant material with an equilibrium humidity level less than 1000 ppm, or a desiccant material with an equilibrium humidity level greater than 1000 ppm. Examples of the former include those described above for the second desiccant material. Some examples of the latter include silica gel, materials commonly referred to as Drierite materials, and molecular sieves that have not been treated at high temperatures. Particularly useful are evaporated or sputtered Ca, Alq, and aluminum/Alq mixtures, or combinations thereof. The thickness of the first desiccant material is typically in the range of 10 nm to several microns. The thickness must be sufficient to absorb all moisture in the compliant protection layer. Those skilled in the art will understand that the necessary thickness will be dependent upon the nature and reactivity of the desiccant material and the moisture content of the compliant protection layer.

The compliant protection layer can comprise organic or mixed organic and inorganic materials and can comprise a single layer or multiple layers of different materials or mixtures of materials. The compliant protection layer is desirably electrically insulating and should be substantially free from residual moisture and solvents. Any residual solvents from formulations or processing the compliant protection layer should not be harmful to the OLED during normal usage. Because of stress induced by flexing of the substrate or the encapsulation container, the compliant protection layer must not be excessively hard or brittle, that is, it has a Young's Modulus of less than 4 gigapascals (GPa). Some non-limiting examples of compliant protection layer materials include multilayer materials such as aluminum oxide/acrylate polymers; polymer layers such as epoxy, polyester, polyolefins, or compliant tapes such as Kapton; silicones; multiple layers of organic, or combined organic and inorganic materials; or mixtures of any of these. The compliant protection layer is typically provided in a thickness of several hundreds of nanometers to tens of microns.

Useful techniques of forming layers of compliant protection layer material from a vapor phase include, but are not limited to, thermal physical vapor deposition, sputter deposition, electron beam deposition, chemical vapor deposition, plasma-enhanced chemical vapor deposition, laser-induced chemical vapor deposition, and atomic layer deposition. In some instances, said materials can be deposited from a solution or another fluidized matrix, e.g., from a supercritical solution of $CO_2$ or by screen printing, ink-jet printing, or spin coating. Care must be taken to choose a solvent or fluid matrix that does not negatively affect the performance of the OLED device. Patterning of said materials can be achieved through many techniques including, but not limited to, photolithography techniques, lift-off techniques, laser ablation techniques, and shadow mask techniques.

Encapsulation container 70 can comprise an organic solid, an inorganic solid, or a combination of organic and inorganic solids. Encapsulation container 70 can be rigid or flexible, and can be processed as separate individual pieces, such as sheets or wafers, or as continuous rolls. Typical protective cover materials include glass, plastic, metal, ceramic, semiconductor, metal oxide, metal nitride, metal sulfide, semiconductor oxide, semiconductor nitride, semiconductor sulfide, carbon or combinations thereof. The portion of encapsulation container 70 over organic layers 40 is transparent if OLED display 100 is top-emitting, but portions that cover non-emitting regions can be opaque. Encapsulation container 70 can be a homogeneous mixture of materials, a composite of materials, multiple layers of materials, or an assembly of multiple materials such as a transparent window with an opaque frame. Encapsulation container 70 can be a metal foil such as aluminum foil, a metal-coated polymer sheet, or a multi-layer laminated foil comprising a polymer layer, a graphite layer, and a layer of aluminum foil. One example of the latter material is eGraf, which is commercially available from GrafTech. In one desirable embodiment, encapsulation container 70 is a metal foil.

Sealing material 80 can be organic, inorganic, or a combination of organic and inorganic. The organic sealing material can include epoxies, polyurethanes, acrylates, silicones, polyamides, polyolefins, and polyesters, or combinations thereof. The inorganic sealing material can include glass, ceramic, metal, semiconductor, metal oxide, semiconductor oxide, and metal solder, or combinations thereof. The sealing material can be bonded between substrate 10 and encapsulation container 70 in a bonding step accomplished by pressing, by melting and cooling, by reaction curing, or by a combination thereof. Typical materials bonded by pressure include pressure-sensitive adhesives. Typical materials bonded by melting and cooling include glass; hot melt adhesives such as polyolefins, polyesters, polyamides, or combinations thereof, or inorganic solders such as indium, tin, lead, silver, gold, or combinations thereof. Typical reaction curing methods include reactions resulting from heat, radiation such as UV radiation, mixing of two or more components, removal of ambient oxygen, or combinations thereof. Typical materials bonded by reaction curing include acrylates, epoxies, polyurethanes, silicones, or combinations thereof. Other inorganic materials typically used in sealing materials include glass, ceramic, metal, semiconductor, metal oxide, semiconductor oxide, or combinations thereof.

Substrate 10 can be an organic solid, an inorganic solid, or a combination of organic and inorganic solids. Substrate 10 can be rigid or flexible and can be processed as separate individual pieces, such as sheets or wafers, or as a continuous roll. If substrate 10 is flexible, it is meant that it is not rigid and provides no structural benefit, e.g. glass of 1 mm thickness or less. Typical substrate materials include glass, plastic, metal, ceramic, semiconductor, metal oxide, metal nitride, metal sulfide, semiconductor oxide, semiconductor nitride, semiconductor sulfide, carbon, or combinations thereof, or any other materials commonly used in the formation of OLED devices, which can be either passive-matrix devices or active-matrix devices. Substrate 10 can be a homogeneous mixture of materials, a composite of materials, or multiple layers of materials. Substrate 10 can be an OLED substrate, that is a substrate commonly used for preparing OLED devices, e.g. active-matrix low-temperature polysilicon or amorphous-silicon TFT substrate. For a top-emitting application, where the EL emission is viewed through the top electrode, the transmissive characteristic of the bottom support is immaterial, and therefore can be light transmissive, light absorbing or light reflective. For a bottom-emitting application, where the EL emission is viewed through the bottom electrode and substrate, the substrate can be any transmissive material including, but not limited to, glass and plastic.

OLED devices that can be used in this invention have been well described in the art, and OLED display 100 can include layers commonly used for such devices. A bottom electrode 20 is formed over OLED substrate 10 and is most commonly configured as an anode, although the practice of this invention is not limited to this configuration. Example conductors for this application include, but are not limited to, indium-tin oxide, indium-zinc oxide, gold, iridium, molybdenum, palladium, platinum, aluminum or silver. If the device is bottom-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Any suitable process such as evaporation, sputtering, chemical vapor deposition, or electrochemical deposition can deposit desired anode materials. Anode materials can be patterned using well known photolithographic processes.

Organic layers 40 comprise several layers as described in the art. While not always necessary, it is often useful that a hole-transporting layer be formed and disposed over the anode. Any suitable process such as evaporation, sputtering, chemical vapor deposition, electrochemical deposition, thermal transfer, or laser thermal transfer from a donor material can deposit desired hole-transporting materials. Hole-transporting materials useful in hole-transporting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. In U.S. Pat. No. 3,180,730, Klupfel et al illustrate exemplary monomeric triarylamines. Other suitable triarylamines substituted with one or more vinyl radicals, or comprising at least one active hydrogen-containing group are disclosed by Brantley et al, in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

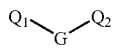

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

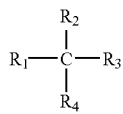

B where:

$R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural Formula C.

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

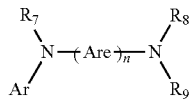

D wherein:

each Are is an independently selected arylene group, such as a phenylene or anthracene moiety;

n is an integer of from 1 to 4; and

Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate), also called PEDOT/PSS.

Light-emitting layers produce light in response to hole-electron recombination. The light-emitting layers are commonly disposed over the hole-transporting layer. Any suitable process such as evaporation, sputtering, chemical vapor deposition, electrochemical deposition, or radiation thermal transfer from a donor material can deposit desired organic light-emitting materials. Useful organic light-emitting materials are well known. As more fully described in U.S. Pat. Nos. 4,769,292 and 5,935,721, the light-emitting layers of the OLED element comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Host and emitting molecules known to be of use include, but are not limited to, those disclosed in U.S. Pat. Nos. 4,768, 292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

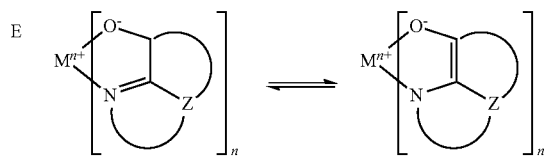

wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material in the light-emitting layers can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distyrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

While not always necessary, it is often useful to include an electron-transporting layer disposed over the light-emitting layers. Any suitable process such as evaporation, sputtering, chemical vapor deposition, electrochemical deposition, thermal transfer, or laser thermal transfer from a donor material can deposit desired electron-transporting materials. Preferred electron-transporting materials for use in the electron-transporting layer are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Certain benzazoles are also useful electron-transporting materials. Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials known in the art.

An upper electrode 30 most commonly configured as a cathode is formed over the electron-transporting layer, or over the light-emitting layers if an electron-transporting layer is not used. If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. Evaporation, sputtering, or chemical vapor deposition processes can be used to deposit cathode materials. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

OLED display 100 can include other layers as well. For example, a hole-injecting layer can be formed over the anode, as described in U.S. Pat. Nos. 4,720,432, 6,208,075, EP 0 891 121 A1, and EP 1 029 909 A1. An electron-injecting layer, such as alkaline or alkaline earth metals, alkali halide salts, or alkaline or alkaline earth metal doped organic layers, can also be present between the cathode and the electron-transporting layer.

The invention has been described in detail with particular reference to certain preferred embodiments thereof, but it will be understood that variations and modifications can be effected within the spirit and scope of the invention.

PARTS LIST 10 substrate
20 electrode
30 electrode
40 organic layers
50 first desiccant material
55 first desiccant material
57 first desiccant material
60 compliant protection layer
65 compliant protection layer
67 compliant protection layer
70 encapsulation container
75 insulator 80 sealing material
90 second desiccant material
95 second desiccant material
100 OLED display
110 OLED display
120 OLED display

The invention claimed is:

1. An OLED display, comprising:
   a. a substrate;
   b. an OLED having a first electrode disposed over the substrate, organic layers disposed over the first electrode, and a second electrode disposed over the organic layers;
   c. a first desiccant material disposed over and in direct contact with at least a portion of the second electrode;
   d. a compliant protection layer having a Young's Modulus <4 GPa disposed over and in direct contact with at least a portion of the first desiccant material but spaced from the second electrode;
   e. a second desiccant material disposed over and in direct contact with at least a portion of the compliant protection layer; and
   f. an encapsulation container fixed to the substrate and disposed over the compliant protection layer, the second desiccant material being formed on an inner surface of the encapsulation container.

2. The OLED display of claim 1 wherein the encapsulation container is spaced from the compliant protection layer to form an enclosure.

3. The OLED display of claim 1 wherein the compliant protection layer covers one of the electrodes and the organic layers and is in contact with the substrate.

4. The OLED display of claim 1 wherein the substrate is flexible.

5. The OLED display of claim 1 wherein the first desiccant material includes Ca, Alq, or Al, or combinations thereof.

6. The OLED display of claim 1 wherein the encapsulation container is formed of a metal foil.

7. An OLED display, comprising:
   a. a substrate;
   b. an OLED having a first electrode disposed over the substrate, organic layers disposed over the first electrode, and a second electrode disposed over the organic layers;
   c. a first desiccant material disposed over and in direct contact with at least a portion of the second electrode;
   d. a compliant protection layer having a Young's Modulus <4 GPa disposed over and in direct contact with at least a portion of the first desiccant material but spaced from the second electrode;
   e. a second desiccant material disposed over and in direct contact with at least a portion of the first electrode; and
   f. an encapsulation container fixed to the substrate and disposed over the compliant protection layer, the second desiccant material being formed on an inner surface of the encapsulation container.

8. The OLED display of claim 7 wherein the encapsulation container is in direct contact with the compliant protection layer.

9. The OLED display of claim 7 wherein the compliant protection layer covers one of the electrodes and the organic layers and is in direct contact with the substrate.

10. The OLED display of claim 7 wherein the substrate is flexible.

11. The OLED display of claim 7 wherein the first desiccant material includes Ca, Alq, or Al, or combinations thereof.

12. The OLED display of claim 7 wherein the encapsulation container is formed of a metal foil.

13. The OLED display of claim 7 further comprises an insulator disposed over and in direct contact with the substrate, wherein the insulator is configured to prevent contact between the first electrode and the second electrode.

14. The OLED display of claim 7 further comprises a sealing material disposed over and in direct contact with the substrate.

15. The OLED display of claim 14 wherein the second desiccant material is disposed inside of the sealing material.

16. The OLED display of claim 14 wherein the encapsulation container is fixed to the substrate by the sealing material.

17. The OLED display of claim 1 further comprises an insulator disposed over and in direct contact with the substrate, wherein the insulator is configured to prevent contact between the first electrode and the second electrode.

18. The OLED display of claim 1 further comprises a sealing material disposed over and in direct contact with the substrate.

19. The OLED display of claim 18 wherein the second desiccant material is disposed inside of the sealing material.

20. The OLED display of claim 18 wherein the encapsulation container is fixed to the substrate by the sealing material.

* * * * *